(12) United States Patent
Iba et al.

(10) Patent No.: US 6,546,622 B2
(45) Date of Patent: Apr. 15, 2003

(54) PRINTED-WIRING SUBSTRATE AND METHOD FOR FABRICATING THE SAME

(75) Inventors: Masahiro Iba, Aichi (JP); Hisashi Wakako, Aichi (JP); Kazuhisa Sato, Aichi (JP); Haruhiko Murata, Aichi (JP); Kazuyuki Takahashi, Aichi (JP); Kenzo Kawaguchi, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 104 days.

(21) Appl. No.: 09/808,980

(22) Filed: Mar. 16, 2001

(65) Prior Publication Data

US 2001/0052183 A1 Dec. 20, 2001

(30) Foreign Application Priority Data

Mar. 28, 2000 (JP) ........................................ 2000-089428

(51) Int. Cl.⁷ ................................................. H05K 3/02
(52) U.S. Cl. ............................. 29/846; 29/829; 29/830; 29/847; 29/848
(58) Field of Search ...................... 29/829, 846, 830, 29/847, 848, 852, 842, 843

(56) References Cited

U.S. PATENT DOCUMENTS

| | | | | |
|---|---|---|---|---|
| 5,451,721 A | * | 9/1995 | Tsukada et al. ............. | 174/261 |
| 6,074,728 A | * | 6/2000 | Ryu .............................. | 174/255 |
| 6,294,744 B1 | * | 9/2001 | Kinoshita .................... | 174/255 |
| 6,303,880 B1 | * | 10/2001 | Asai et al. ................... | 174/255 |
| 6,378,201 B1 | * | 4/2002 | Tsukada et al. ............. | 174/265 |

FOREIGN PATENT DOCUMENTS

JP  11-251752  9/1999

\* cited by examiner

*Primary Examiner*—Timothy V. Eley
*Assistant Examiner*—Alvin J. Grant
(74) *Attorney, Agent, or Firm*—Sughrue Mion, PLLC

(57) ABSTRACT

A printed-wiring substrate 1 includes internal dielectric resin layers 12 and 14. A main-surface-side external dielectric resin layer 13 is formed on the internal dielectric resin layer 12 such that the surface thereof serves as a substrate main-surface 1A. A back-surface-side external dielectric resin layer 15 is formed on the internal dielectric resin layer 14 such that the surface thereof serves as a substrate back-surface 1B. A surface 12A of the main-surface-side internal dielectric resin layer 12 and a surface 14A of the back-surface-side internal dielectric resin layer 14 are roughened. The substrate main-surface 1A and the substrate back-surface 1B are roughened such that surface roughness thereof is lower than that of the surfaces 12A and 14A.

10 Claims, 4 Drawing Sheets

PRINTED-WIRING SUBSTRATE AND METHOD FOR FABRICATING THE SAME

BACKGROUND OF THE INVENTION

1. Field of the Invention

The present invention relates to a printed-wiring substrate and a method for fabricating the printed-wiring substrate. More particularly, the invention relates to a printed-wiring substrate including a dielectric resin layer, which forms a substrate surface, and to a method for fabricating the printed-wiring substrate.

2. Description of the Related Art

Conventionally, a printed-wiring substrate including a plurality of dielectric resin layers is known. Of the dielectric resin layers, a surface of an internal dielectric resin layer, which is formed in a substrate, is usually roughened at the surface thereof in order to enhance bonding strength for bonding to a conductor layer, such as a wiring layer, adjacent thereto, or to bond to another dielectric resin layer adjacent thereto. By roughening the surface of an internal dielectric resin layer, the enhancement of bonding strength for bonding to a conductor layer or the like can be expected from an anchoring effect provided by pits and projections formed on the roughened surface.

In contrast to an internal dielectric resin layer, the surface of an external dielectric resin layer (for example, a solder resist layer), which serves as the surface of a printed-wiring substrate, does not need to be roughened, since a conductive layer or another dielectric resin layer is not formed thereon. Accordingly, the substrate surface (surface of an external dielectric resin layer) has conventionally not been roughened.

3. Problems to be Solved by the Invention

Usually, a component number, a serial number, or the like of a printed-wiring substrate is marked on the surface of the printed-wiring substrate by means of a marking ink layer, such as an ink swatch or white paint. However, in some cases, because of low bonding strength between the substrate surface and the marking ink layer formed thereon, the marking ink layer tends to come off the substrate surface.

When an electronic component, such as an IC chip, is to be soldered onto the surface of a printed-wiring substrate, flux may be applied to substantially the entire substrate surface in order to remove oxides contained in solder to thereby enhance connection reliability. However, in some cases, the applied flux is repelled by the substrate surface and thus fails to uniformly spread over the entire substrate surface in a wetted condition.

When an IC chip or the like is mounted on a printed-wiring substrate, an under-fill may be filled (applied) into a gap between the IC chip and the printed-wiring substrate in order to enhance connection reliability therebetween. However, in some cases, the applied under-fill may fail to appropriately spread on the substrate surface in a wetted condition. This results in the formation of an unfilled portion of the gap between the IC chip and the printed-wiring substrate.

SUMMARY OF THE INVENTION

The present invention has been achieved in view of the foregoing. It is therefore an object of the invention to provide a printed-wiring substrate capable of suppressing a potential problem in processing a substrate surface, such as formation of a marking ink layer or application of flux or under-fill, as well as to provide a method for fabricating the printed-wiring substrate.

The above object of the present invention has been achieved by providing a printed-wiring substrate comprising an external dielectric resin layer which defines a substrate surface. The substrate surface is a roughened surface.

According to the present invention, the surface of the external dielectric resin layer, which serves as the surface of the printed-wiring substrate, is roughened.

Accordingly, when a marking ink layer, such as an ink swatch or white paint, is formed on the substrate surface, an anchoring effect provided by the roughened surface enhances bonding strength for bonding the marking ink layer and the substrate surface, thereby suppressing loss of the marking ink layer from the substrate surface.

When flux is applied to the substrate surface before an electronic component, such as an IC chip, is soldered to the substrate surface, flux is not repelled by the substrate surface, but spreads in a wetted condition, since the activity of the substrate surface is enhanced by roughening. Thus, flux can be uniformly applied to the substrate surface.

When an under-fill is filled into a gap between the substrate surface and an IC chip mounted on the substrate surface, the under-fill spreads properly in a wetted condition, since the activity of the substrate surface is enhanced. Thus, the under-fill reliably fills the gap.

A marking ink layer to be formed on the substrate surface may be a laminate composed of a plurality of marking ink layers, such as an ink swatch, or a single marking ink layer, such as white paint.

Preferably, the above-described printed-wiring substrate further comprises at least one internal dielectric resin layer, which is formed in a substrate. The substrate surface and the surface of the internal dielectric resin layer are roughened surfaces. The roughness of the substrate surface is lower than that of the surface of the internal dielectric resin layer.

As described above, the surface of the internal dielectric resin layer formed in the substrate is preferably roughened to a high level of roughness, in order to enhance bonding strength for bonding the internal dielectric resin layer and a conductor layer or for bonding the same and another dielectric resin layer.

However, if the substrate surface is roughened to a level of roughness as high as that of the internal dielectric resin layer, pits and projections of the roughened surface will become too deep and high for flux to be applied to the substrate surface or for an under-fill to be filled into a gap between a mounted IC chip and the substrate surface so as to spread in a wetted condition.

In contrast, according to the present invention, the substrate surface (the surface of the external dielectric resin layer) and the surface of the internal dielectric resin layer are roughened surfaces, but the roughness of the substrate surface is lower than that of the surface of the internal dielectric resin layer.

Accordingly, sufficient bonding strength can be established for bonding the internal dielectric resin layer and a conductor layer or for bonding the internal dielectric resin layer and another dielectric resin layer. Also, the marking ink layer can be formed on the substrate surface in a very strongly bonded condition, and flux or an under-fill can be reliably applied to the substrate surface.

Preferably, in the above-described printed-wiring substrate, a marking ink layer is formed on a portion of the substrate surface.

According to the present invention, the marking ink layer is formed on the substrate surface, which is a roughened surface. An anchoring effect provided by the roughened surface enhances bonding strength between the marking ink layer and the substrate surface. Thus, the marking ink layer is unlikely to come off the substrate surface, thereby enhancing reliability of the printed-wiring substrate.

Furthermore, when flux is applied to the substrate surface, the substrate surface can be reliably coated with the flux. Also, when an under-fill is filled into a gap between the substrate surface and an IC chip or the like, the gap can be reliably filled with the under-fill.

Preferably, in the above-described printed-wiring substrate, the marking ink layer comprises a first marking ink layer, which is formed on the substrate surface, and a second marking ink layer, which is formed on the first marking ink layer. The first marking ink layer absorbs laser radiation. The second marking ink layer assumes a color tone different from that of the first marking ink layer, and absorbs laser radiation to a higher degree than does the first marking ink layer.

In the printed-wiring substrate, the overlying second marking ink layer absorbs more laser radiation than does the underlying first marking ink layer. Thus, by irradiating the two-layered marking ink layer with, for example, a $CO_2$ laser beam, a portion of the overlying second marking ink layer alone can be easily removed, thereby exposing the underlying first marking ink layer. Therefore, a marking step, such as marking a component number of the printed-wiring substrate, can be easily carried out.

The present invention further provides a method for fabricating a printed-wiring substrate comprising an external dielectric resin layer which defines a substrate surface, which method comprises roughening the substrate surface.

According to the present invention, the substrate surface (the surface of the external dielectric resin layer) is roughened.

Thus, when a marking ink layer is formed on a portion of the substrate surface, the marking ink layer can be formed in a very strongly bonded condition.

Also, when flux is applied to the substrate surface, flux can be reliably applied, since flux spreads in a good wetted condition. When an under-fill is filled into a gap between the substrate surface and an IC chip mounted on the substrate surface, the gap can be reliably filled with the under-fill, since the under-fill spreads in a good wetted condition.

The present invention still further provides a method for fabricating a printed-wiring substrate comprising an external dielectric resin layer which defines a substrate surface, and a connection pad exposed in an opening which extends through the external dielectric resin layer. The method comprises an external-dielectric-resin-layer roughening step for roughening the external dielectric resin layer among layers of the printed-wiring substrate, in which the connection pad is exposed in the opening of the external dielectric resin layer, which forms the substrate surface; a Ni—Au-plating-layer forming step for forming, after the external-dielectric-resin-layer roughening step, an Ni plating layer on the connection pad exposed in the opening and then forming an Au plating layer on the Ni plating layer; and an ink-layer forming step for forming a marking ink layer on a portion of the substrate surface after the external-dielectric-resin-layer roughening step and before or after the Ni—Au-plating-layer forming step.

According to the present invention, in the external-dielectric-resin-layer roughening step, the external dielectric resin layer (solder resist layer) among the layers of the printed-wiring substrate is roughened. Thus, the surface of the external dielectric resin layer (substrate surface) is roughened, and residue, such as resin, remaining in the opening formed in the external dielectric resin layer is removed. Therefore, in the subsequently performed Ni—Au-plating-layer forming step, the Ni—Au plating layer can be reliably formed on the connection pad exposed in the opening.

Furthermore, since the substrate surface is roughened before the ink-layer forming step, the marking ink layer can be formed on the substrate surface with a very high bonding strength in the ink-layer forming step.

Preferably, in the above-described method for fabricating a printed-wiring substrate, the ink-layer forming step comprises the steps of forming a first marking ink layer on the substrate surface; and forming a second marking ink layer on the first marking ink layer. The first marking ink layer exhibits low laser radiation absorption. The second marking ink layer assumes a color tone different from that of the first marking ink layer and absorbs laser radiation to a higher degree than does the first marking ink layer.

The thus-formed, two-layered marking ink layer allows easy formation of a marking, such as a component number of the printed-wiring substrate. Specifically, by irradiating the two-layered marking ink layer, for example, with a $CO_2$ laser beam, a portion of the overlying second marking ink layer is removed to thereby expose the underlying first marking ink layer for forming a marking.

Preferably, the above-described method for fabricating a printed-wiring substrate further comprises a solder-bump forming step for forming a solder bump on the Ni—Au plating layer on the connection pad exposed in the opening, after the Ni—Au-plating-layer forming step and the ink-layer forming step, wherein the ink-layer forming step is an ink-layer printing step for forming a marking ink layer on a portion of the substrate surface by printing.

According to the present invention, the marking ink layer is formed by printing before the step of forming a solder bump.

Since solder bumps are not present on the substrate surface when the marking ink layer is formed, a printing mask can be reliably placed on the substrate surface. Thus, the marking ink layer can be reliably formed on the substrate surface by printing.

BRIEF DESCRIPTION OF THE DRAWINGS

FIG. 1 includes two views showing a printed-wiring substrate according to an embodiment of the present invention, wherein FIG. 1(a) is a plan view, and FIG. 1(b) is a side view.

FIG. 3 includes two views showing a method for fabricating the printed-wiring substrate according to the embodiment, wherein FIG. 3(a) is a view showing a printed-wiring substrate in which connection pads are exposed in openings formed in an external dielectric resin layer, and FIG. 3(b) is a view showing the state after the external dielectric resin layer has been roughened.

FIG. 4 includes two views showing the method for fabricating the printed-wiring substrate according to the above embodiment, wherein FIG. 4(a) is a view showing the state after Ni—Au plating layers have been formed on the connection pads exposed in the openings, and FIG. 4(b) is a view showing the state after an ink swatch has been formed.

DESCRIPTION OF REFERENCE NUMERALS USED IN THE DRAWINGS

Figure 1:
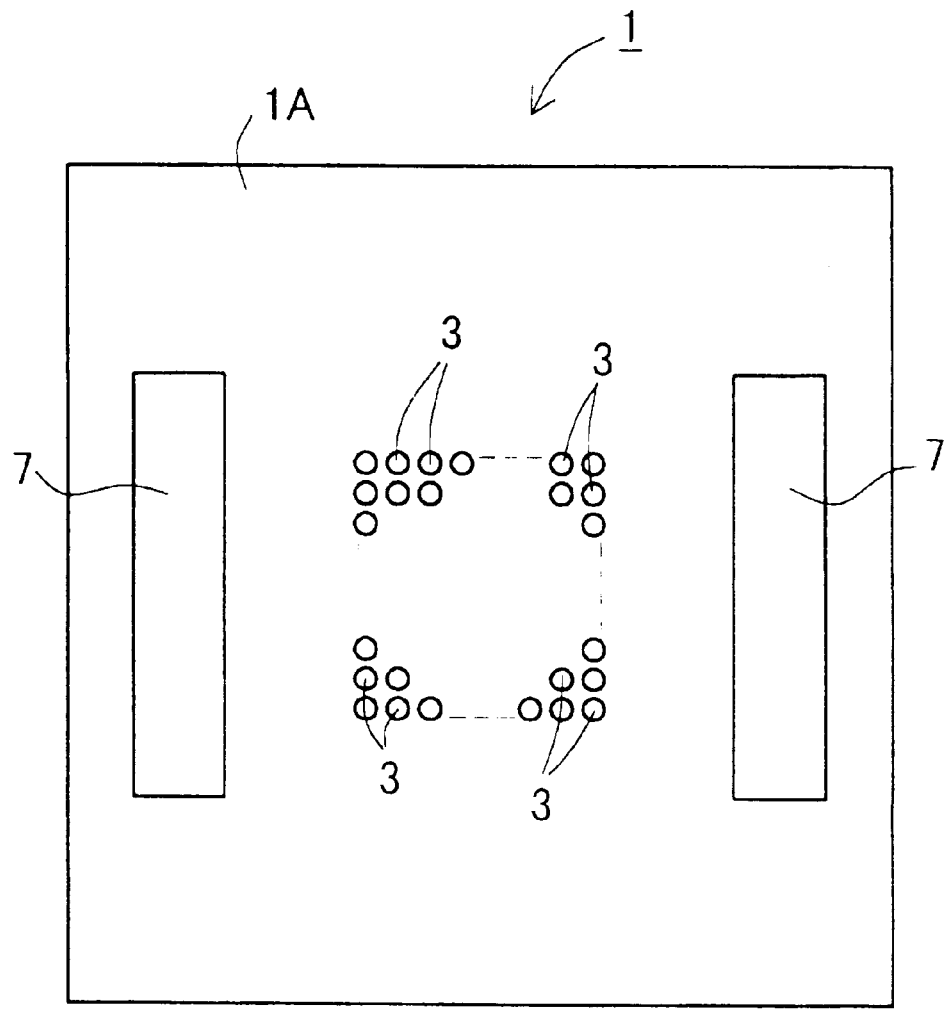
Figure 1:
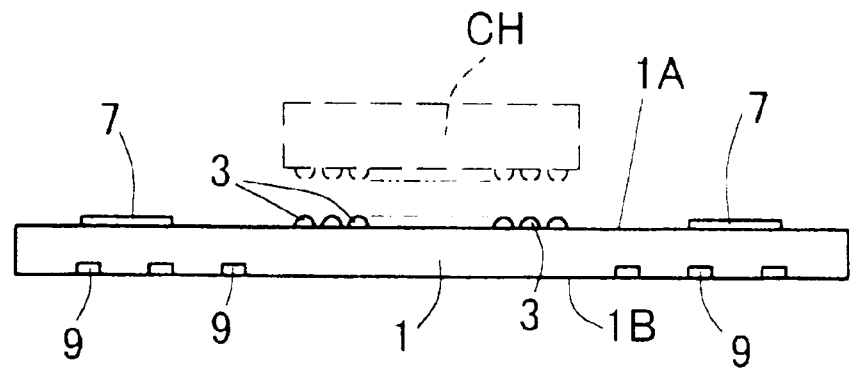

1: printed-wiring substrate
1A: substrate main-surface (substrate surface)
1B: substrate back-surface (substrate surface)
3: solder bump
5: first marking ink layer
6: second marking ink layer
7: ink swatch (marking ink layer)
9: pad
11: central internal dielectric resin layer
12: main-surface-side internal dielectric resin layer (internal dielectric resin layer)
13: main-surface-side external dielectric resin layer (external dielectric resin layer)
13K: main-surface-side opening
14: back-surface-side internal dielectric resin layer (internal dielectric resin layer)
15: back-surface-side external dielectric resin layer (external dielectric resin layer)
15K: back-surface-side opening
23P: main-surface-side connection pad
25P: back-surface-side connection pad
27: main-surface-side Ni—Au plating layer
29: back-surface-side Ni—Au plating layer

DETAILED DESCRIPTION OF THE PREFERRED EMBODIMENTS

An embodiment of the present invention will next be described in detail with reference to the drawings. However, the present invention should not be construed as being limited thereto.

Figure 2:
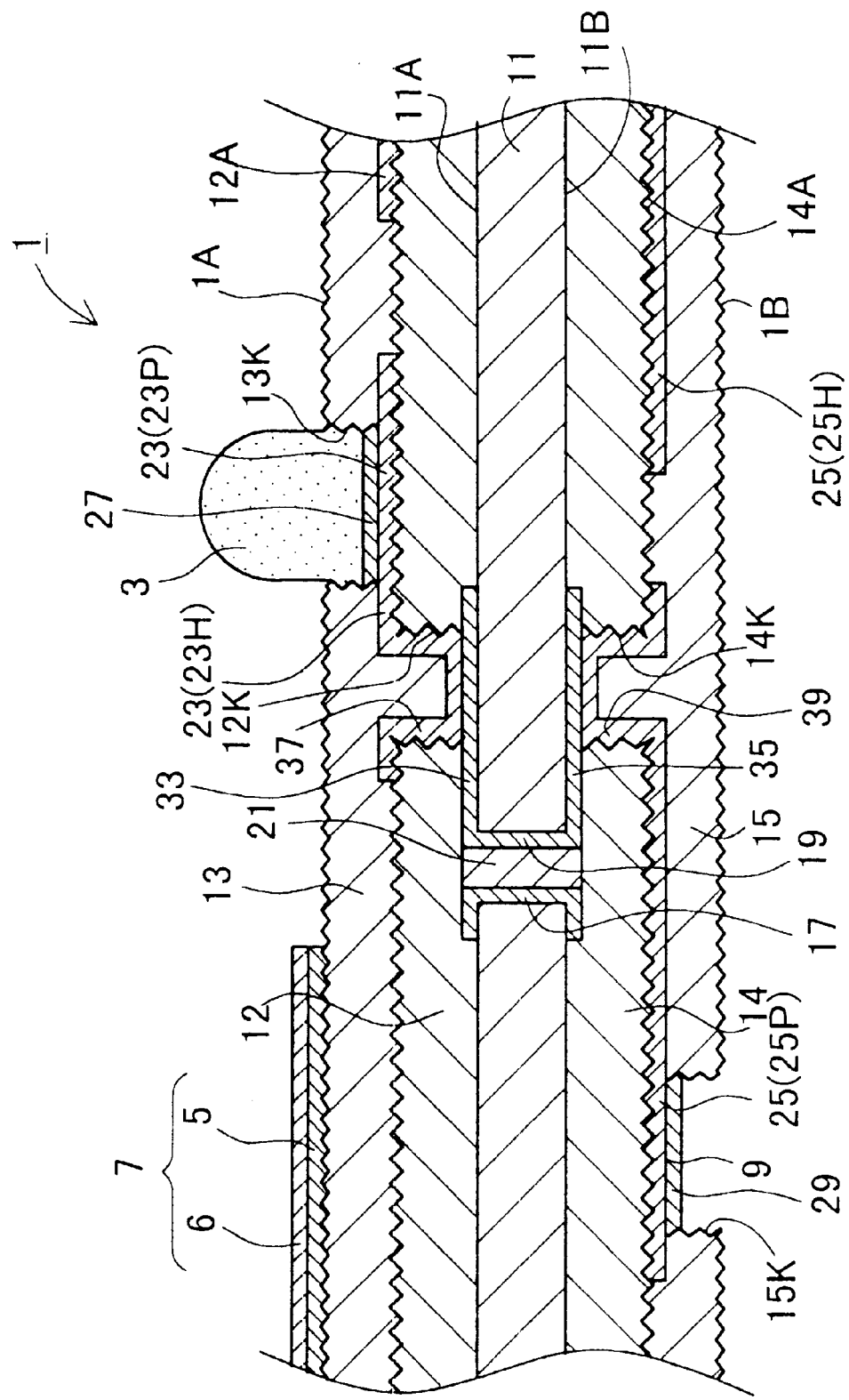
FIG. 2 is a partially enlarged sectional view of the printed-wiring substrate according to the embodiment.

FIGS. 1(a) and 1(b) show a printed-wiring substrate 1 according to the present embodiment, wherein FIG. 1(a) shows a plan view of the printed-wiring substrate 1, and FIG. 1(b) shows a side view of the printed-wiring substrate 1. FIG. 2 shows a partially enlarged sectional view of the printed-wiring substrate 1. As shown in FIG. 1(b), the printed-wiring substrate 1 includes a substrate main-surface (substrate surface) 1A and a substrate back-surface (substrate surface) 1B and assumes a substantially rectangular plate-like form. An IC chip CH, which is represented by a dashed line in FIG. 1(b), or the like can be connected to the substrate main-surface 1A, whereas an unillustrated motherboard or the like can be connected to the substrate back-surface 1B.

As shown in FIG. 1(a), a number of bumps 3, which serve as connection terminals for connection with corresponding terminals of the IC chip CH, are arranged in a substantially rectangular array as viewed from above at a substantially central region of the substrate main-surface 1A of the printed-wiring substrate 1. An ink swatch (marking ink layer) 7 assuming a substantially rectangular shape as viewed from above is formed on the substrate main-surface 1A by printing at the left side of the substantially central region where the solder bumps 3 are formed as well as at the right side of the region. As shown in FIG. 2, the ink swatch 7 includes a white first marking ink layer 5 formed on the substrate main-surface 1A and a black second marking ink layer 6 formed on the first marking ink layer 5.

As shown in FIG. 1(b), a number of pads 9, which serve as connection terminals for connection to the corresponding terminals of a motherboard or the like, are formed on the substrate back-surface 1B of the printed-wiring substrate 1.

The ink swatch 7 is adapted to display, for example, a component number or a serial number of the printed-wiring substrate 1 or the IC chip CH mounted on the printed-wiring substrate 1. The ink swatch 7 is irradiated with a $CO_2$ laser beam so as to remove a portion of the black second marking ink layer 6, to thereby expose the white first marking ink layer 5. In this manner, a desired marking composed of, for example, white characters on a black background can be easily formed.

As shown in FIG. 2, the printed-wiring substrate 1 includes a central internal dielectric resin layer 11, which is disposed at the center of the same and assumes a substantially plate-like form. A main-surface-side internal dielectric resin layer (internal dielectric resin layer) 12 is formed on a main surface 11A of the central internal dielectric resin layer 11. A main-surface-side external dielectric resin layer (external dielectric resin layer) 13, whose surface serves as the substrate main-surface 1A, is formed on the main-surface-side internal dielectric resin layer 12. A back-surface-side internal dielectric resin layer (internal dielectric resin layer) 14 is formed on a back surface 11B of the central internal dielectric resin layer 11. A back-surface-side external dielectric resin layer (external dielectric resin layer) 15, whose surface serves as the substrate back-surface 1B, is formed on the back-surface-side internal dielectric resin layer 14.

The external and internal resin layers may comprise, for example, epoxy resin. The resin layers are cured resin layers.

A number of through holes 17 are formed in the central internal dielectric resin layer 11 so as to extend through the same. A substantially cylindrical through hole conductor 19 is formed on the wall surface of each of the through holes 17. The through hole conductor 19 is filled with a resin filler 21.

A main-surface-side first conductor layer 33, such as a wiring, to be connected to the through hole conductor 19, is formed between the central internal dielectric resin layer 11 and the main-surface-side internal dielectric resin layer 12. Similarly, a back-surface-side first conductor layer 35, such as a wiring, to be connected to the through hole conductor 19, is formed between the central internal dielectric resin layer 11 and the back-surface-side internal dielectric resin layer 14.

A number of through holes 12K are formed in the main-surface-side internal dielectric resin layer 12 so as to extend through the same. A main-surface-side via conductor 37, which is connected to the main-surface-side first conductor layer 33, is formed on the wall surface of each of the through holes 12K. Similarly, a number of through holes 14K are formed in the back-surface-side internal dielectric resin layer 14 so as to extend through the same. A back-surface-side via conductor 39, which is connected to the back-surface-side first conductor layer 35, is formed on the wall surface of each of the through holes 14K.

A main-surface-side second conductor layer 23, such as a main-surface-side wiring 23H and a main-surface-side connection pad 23P, to be connected to the main-surface-side via conductor 37 is formed between the main-surface-side internal dielectric resin layer 12 and the main-surface-side external dielectric resin layer 13. Similarly, a back-surface-side second conductor layer 25, such as a back-surface-side wiring 25H and a back-surface-side connection pad 25P, to be connected to the back-surface-side via conductor 39 is formed between the back-surface-side internal dielectric resin layer 14 and the back-surface-side external dielectric resin layer 15.

A number of main-surface-side openings 13K are formed in the main-surface-side external dielectric resin layer 13 so as to extend through the same and locate above the corresponding main-surface-side connection pads 23P of the main-surface-side second conductor layer 23. A main-surface-side Ni plating layer 27 is formed on each of the main-surface-side connection pads 23P accommodated within the corresponding main-surface-side openings 13K. The previously-mentioned solder bumps 3 are formed on the corresponding main-surface-side Ni plating layers 27.

A number of back-surface-side openings 15K are formed in the back-surface-side external dielectric resin layer 15 so as to extend through the same and accommodate the corresponding back-surface-side connection pads 25P of the back-surface-side second conductor layer 25. A back-surface-side Ni—Au plating layer 29 is formed on each of the back-surface-side connection pads 25P accommodated within the corresponding back-surface-side openings 15K, thereby forming the previously-mentioned pad 9. The back-surface-side Ni—Au plating layer 29 includes an Ni plating layer and an Au plating layer, which is formed on the Ni plating layer.

Surfaces 12A and 14A of the main-surface-side internal dielectric resin layer 12 and the back-surface-side internal dielectric resin layer 14, respectively, and the wall surface of each of the through holes 12K and 14K formed in the main-surface-side internal dielectric resin layer 12 and the back-surface-side internal dielectric resin layer 14, respectively, are roughened to a surface roughness Ra (JIS B0601 (1994)) of about 0.47 $\mu$m. The surface roughness Ra is the average of three measurements of the surface roughness Ra (measuring apparatus: Veeco/WYKO SP3200 PROFILING SYSTEM).

Thus, bonding strength of the main-surface-side second conductor layer 23 which bonds to the main-surface-side internal dielectric resin layer 12, bonding strength of the back-surface-side second conductor layer 25 which bonds to the back-surface-side internal dielectric resin layer 14, bonding strength of the main-surface-side via conductor 37 which bonds to the wall surface of each of the through holes 12K, and bonding strength of the back-surface-side via conductor 39 which bonds to the wall surface of each of the through holes 14K are enhanced by means of an anchoring effect provided by pits and projections of the roughened surfaces. Also, bonding strength of the main-surface-side external dielectric resin layer 13 which bonds to the main-surface-side internal dielectric resin layer 12 and bonding strength of the back-surface-side external dielectric resin layer 15 which bonds to the back-surface-side internal dielectric resin layer 14 are enhanced by the anchoring effect.

In the present embodiment, the surface of the main-surface-side external dielectric resin layer 13 (substrate main-surface 1A), the wall surface of each of the main-surface-side openings 13K, the surface of the back-surface-side external dielectric resin layer 15 (substrate back-surface 1B), and the wall surface of each of the back-surface-side openings 15K are also roughened, although surface roughness thereof is lower than that of the surfaces 12A and 14A of the main-surface-side internal dielectric resin layer 12 and the back-surface-side internal dielectric resin layer 14, respectively. Specifically, the surfaces are roughened to a surface roughness Ra not higher than 40% the roughness of the surface 12A of the main-surface-side internal dielectric resin layer 12, etc., and not lower than 0.1 $\mu$m; e.g., the surfaces are roughened to a surface roughness Ra of about 0.17 $\mu$m.

Thus, bonding strength between the substrate main-surface 1A and the ink swatch 7 is sufficiently enhanced by virtue of an anchoring effect, thereby suppressing a potential loss of ink swatch 7 from the substrate main-surface 1A.

When flux is applied to the substrate main-surface 1A or the substrate back-surface 1B of the printed-wiring substrate 1 in soldering the IC chip CH or the like to the substrate main-surface 1A or soldering a motherboard or the like to the substrate back-surface 1B, the flux can be reliably applied to the surfaces. Since the substrate main-surface 1A and the substrate back-surface 1B are roughened to thereby become highly active, the flux is not repelled by the surfaces, but spreads in a wetted condition.

When an under-fill is filled into a gap between the substrate main-surface 1A and the IC chip CH mounted on the substrate main-surface 1A, the under-fill spreads properly in a wetting condition, since the activity of the substrate main-surface 1A is enhanced. Thus, the under-fill completely fills the gap.

The under-fill is a resin encapsulant which fills the volume around the joints under the chip and is firmly attached to both the chip and the substrate to protect the joints from environmental hazards and to reduce thermal fatigue in the joints.

Next, a method for fabricating the above-described printed-wiring substrate 1 will be described with reference to FIGS. 3 and 4.

Figure 3:
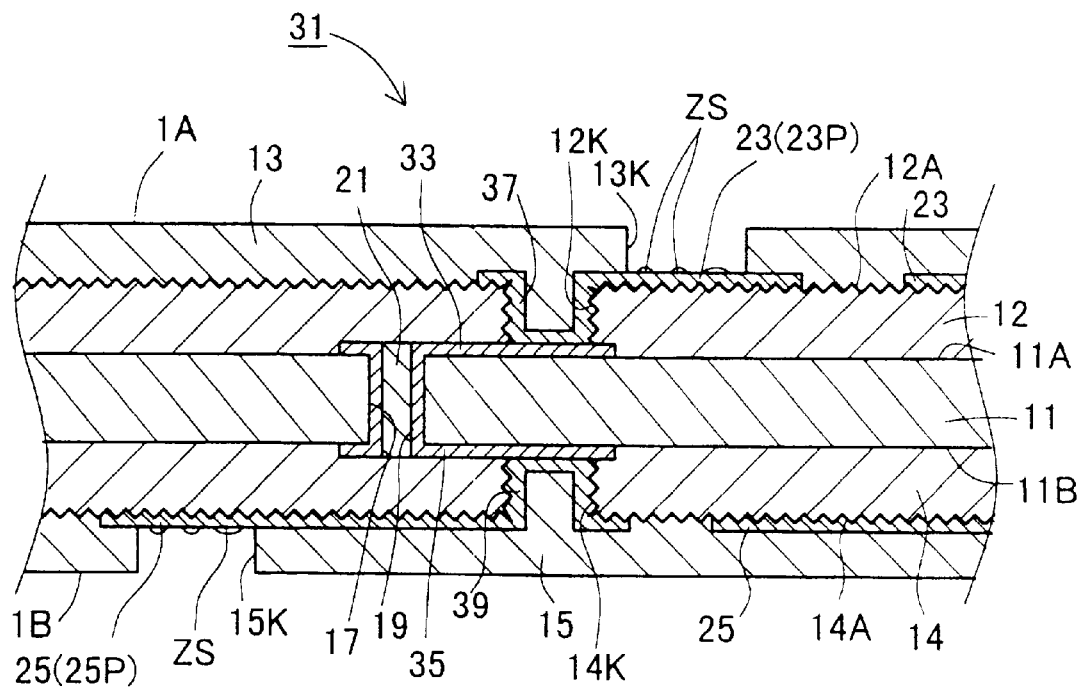
Figure 3:
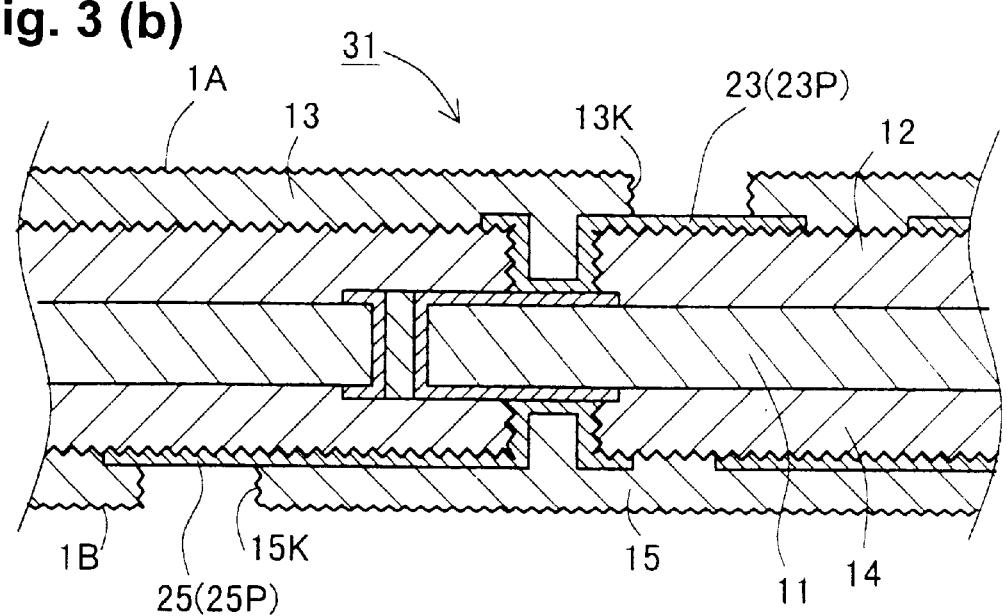
Figure 4:
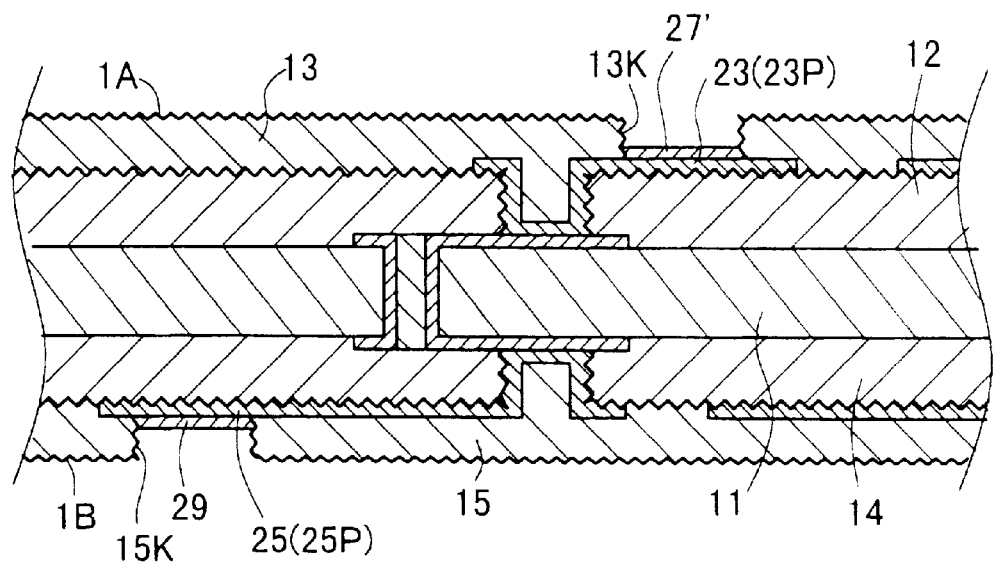
Figure 4:
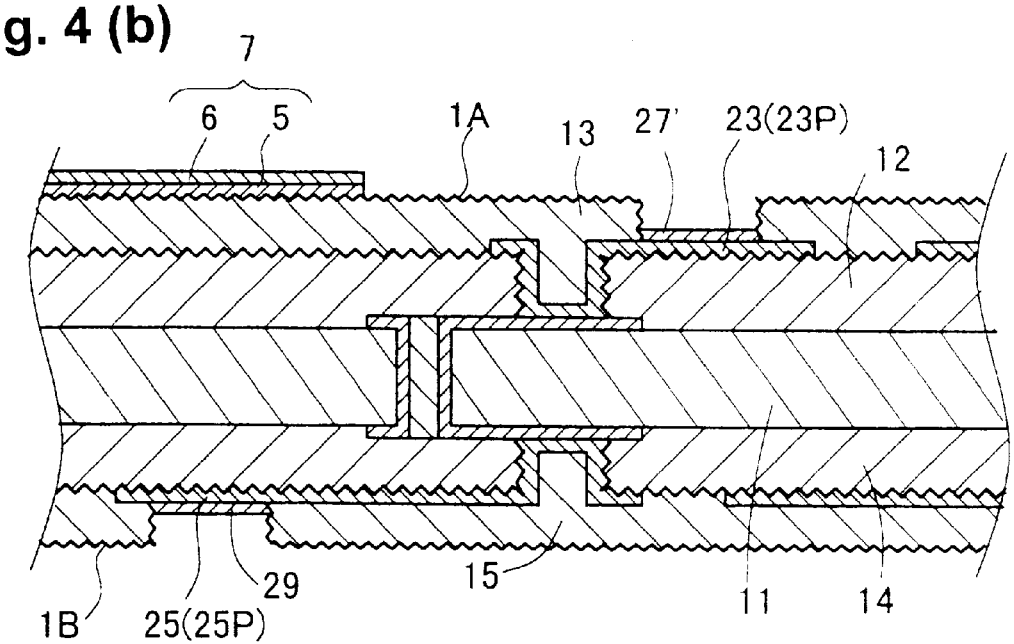

First, as shown in FIG. 3($a$), a printed-wiring substrate 31 is prepared in which the main-surface-side connection pads 23P are exposed in the corresponding main-surface-side openings 13K formed in the main-surface-side external dielectric resin layer 13, whose surface serves as the substrate main-surface 1A and in which the back-surface-side connection pads 25P are exposed in the corresponding back-surface-side openings 15K formed in the back-surface-side external dielectric resin layer 15, whose surface serves as the substrate back-surface 1B.

The printed-wiring substrate 31 is fabricated by a known method in the steps of forming the main-surface-side first conductor layer 33 and the back-surface-side first conductor layer 35 on the central internal dielectric resin layer 11; forming thereon the main-surface-side internal dielectric resin layer 12 and the back-surface-side internal dielectric resin layer 14; forming thereon the main-surface-side second conductor layer 23 and the back-surface-side second conductor layer 25; and forming thereon the main-surface-side external dielectric resin layer 13 and the back-surface-side external dielectric resin layer 15.

Specifically, first, the central internal dielectric resin layer 11 is prepared. The through holes 17 are drilled in the central internal dielectric resin layer 11. By sequential electroless plating and electroplating, a plating layer is formed on each of the main surface 11A and the back surface 11B, and the through hole conductor 19 is formed on the wall surface of each of the through holes 17. Subsequently, the through hole conductors 19 are each filled with the resin filler 21. Then, the plating layer on the main surface 11A and that on the back surface 11B are each etched into a predetermined pattern, thereby forming the main-surface-side first conductor layer 33 and the back-surface-side first conductor layer 35.

Next, the main-surface-side internal dielectric resin layer 12 having the through holes 12K formed therein is formed on the main surface 1A of the central internal dielectric resin layer 11, while the back-surface-side internal dielectric resin layer 14 having the through holes 14K formed therein is formed on the back surface 11B of the central internal dielectric resin layer 11. Then, the main-surface-side internal dielectric resin layer 12 and the back-surface-side internal dielectric resin layer 14 are roughened so as to roughen the surfaces 12A and 14A and the wall surfaces of the through holes 12K and 14K to a surface roughness Ra of about 0.47 μm.

Subsequently, by sequential electroless plating and electroplating, a plating layer is formed on each of the surfaces 12A and 14A; the main-surface-side via conductor 37 is formed on the wall surface of each of the through holes 12K; and the back-surface-side via conductor 39 is formed on the wall surface of each of the through holes 14K. Then, the plating layer on the main surface 12A and that on the back surface 14B are each etched into a predetermined pattern, thereby forming the main-surface-side second conductor layer 23 and the back-surface-side second conductor layer 25.

Subsequently, the main-surface-side external dielectric resin layer 13 having the main-surface-side openings 13K formed therein is formed on the main-surface-side internal dielectric resin layer 12, while the back-surface-side external dielectric resin layer 15 having the back-surface-side openings 15K formed therein is formed on the back-surface-side internal dielectric resin layer 14, thereby yielding the printed-wiring substrate 31.

Next, in the external-dielectric-resin-layer roughening step, as shown in FIG. 3(b), the main-surface-side external dielectric resin layer 13 and the back-surface-side external dielectric resin layer 15 are roughened by contacting with a processing liquid which contains potassium permanganate. In this case, processing conditions are adjusted such that the surface of the main-surface-side external dielectric resin layer 13 (substrate main-surface 1A) and the surface of the back-surface-side external dielectric resin layer 15 (substrate back-surface 1B) assume a surface roughness Ra lower than that (Ra=approx. 0.47 μm) of the main-surface-side internal dielectric resin layer 12 and the back-surface-side internal dielectric resin layer 14, preferably not lower than 0.1 μm. Specifically, the surface roughness Ra was about 0.17 μm. Notably, the surface roughness Ra as measured before roughening was about 0.08 μm.

Exemplary processing conditions for the step of roughening the external surface are a temperature of 40° C., a time of 120 seconds, a $KMnO_4$ concentration of 25 g/ and a maximum $K_2MnO_4$ concentration of 17 g/.

Exemplary processing conditions for the step of roughening the internal surface are a temperature of 80±3° C., a time of 600±3 seconds, a $KMnO_4$ concentration of 55±5 g/ and a maximum $K_2MnO_4$ concentration of 17 g/.

The internal and/or external surfaces may also be roughened by sandblasting instead of or in addition to roughening by contacting with a processing liquid containing potassium permanganate.

When the printed-wiring substrate 31 having the main-surface-side connection pads 23P and the back-surface-side connection pads 25P exposed is fabricated as described above, in some cases, resin residue ZS may remain in the main-surface-side openings 13K formed in the main-surface-side external dielectric resin layer 13 as well as in the back-surface-side openings 15K formed in the back-surface-side external dielectric resin layer 15 (see FIG. 3(a)). However, when the main-surface-side external dielectric resin layer 13 and the back-surface-side external dielectric resin layer 15 are roughened by carrying out the external-dielectric-resin-layer roughening step, the resin residue ZS can also be removed. Accordingly, in the Ni—Au-plating-layer forming step, which will next be described, an Ni—Au layer can be reliably formed on each of the main-surface-side connection pads 23P and the back-surface-side connection pads 25P.

Next, in the Ni—Au-plating-layer forming step, as shown in FIG. 4(a), a main-surface-side Ni—Au plating layer 27' is formed on each of the main-surface-side connection pads 23P exposed in the corresponding main-surface-side openings 13K, while the back-surface-side Ni—Au plating layer 29 is formed on each of the back-surface-side connection pads 25P exposed in the corresponding back-surface-side openings 15K.

Specifically, Ni plating is carried out to thereby form an Ni plating layer having a thickness of 5.00 μm to 7.00 μm on each of the main-surface-side connection pads 23P and the back-surface-side connection pads 25P. Subsequently, Au plating is performed to thereby form an Au plating layer having a thickness of 0.10 μm to 0.40 μm on each of the Ni plating layers, thus forming the main-surface-side Ni—Au plating layers 27' and the back-surface-side Ni—Au plating layers 29.

Next, in the first ink-layer printing step of the ink-layer printing step (ink-layer forming step), a printing mask assuming a predetermined pattern is placed on the substrate main-surface 1A, and white marking ink is applied by printing in a rectangular shape as viewed from above, followed by drying. The first marking ink layer 5 is thus formed (see FIG. 4(b)).

Since the first marking ink layer 5 is formed on the substrate main-surface 1A which has been roughened in the external-dielectric-resin-layer roughening step, the thus formed first marking ink layer 5 exhibits high bonding strength, thereby suppressing a potential problem of the first marking ink layer 5 coming off the substrate main-surface 1A.

Subsequently, in the second ink-layer printing step, a printing mask assuming a predetermined pattern is placed on the substrate main-surface 1A, and black marking ink is applied by printing onto the first marking ink layer 5, followed by drying. The second marking ink layer 6 is thus formed as shown in FIG. 4(b).

Thus, the ink swatch 7, which is formed of two layers; specifically, the first marking ink layer 5 and the second marking ink layer 6, is formed.

In the present embodiment, the ink-layer printing step precedes the solder-bump forming step, which will next be described. Accordingly, when the ink-layer printing step is performed, the solder bumps 3 are not present on the substrate main-surface 1A. Thus, the printing masks can be reliably placed on the substrate main-surface 1A, thereby enabling reliable printing of the first marking ink layer 5 and the second marking ink layer 6.

Next, in the solder-bump forming step, the solder bumps 3 are formed on the corresponding main-surface-side Ni—Au plating layers 27' formed on the corresponding main-surface-side connection pads 23P.

Specifically, a mask assuming a predetermined pattern is placed on the substrate main-surface 1A. Then, solder paste is applied by printing onto the main-surface-side Ni—Au plating layers 27' formed on the corresponding main-surface-side connection pads 23P. Subsequently, the applied solder paste is caused to reflow, thereby forming the solder bumps 3 (see FIG. 2).

Notably, when a solder bump 3 is formed, Au of a main-surface-side Ni—Au plating layer 27' disappears by diffusing into the solder bump 3. As a result, the solder bump 3 is formed on a main-surface-side Ni plating layer 27.

Thus, the printed-wiring substrate 1 of the present embodiment is completed.

While the present invention has been described with reference to the above embodiment, the present invention is not limited thereto, but may be modified as appropriate without departing from the spirit or scope of the invention.

For example, in the above embodiment the printed-wiring substrate 1 is described as being composed of three internal dielectric resin layers (the central internal dielectric resin layer 11, the main-surface-side internal dielectric resin layer 12, and the back-surface-side internal dielectric resin layer 14). However, the printed-wiring substrate 1 may assume the form of a printed-wiring substrate composed of more than three internal dielectric resin layers or the form of a printed-wiring substrate composed of a single internal dielectric resin layer.

In the above embodiment, two ink swatches 7, each assuming a rectangular shape as viewed from above, are formed on the substrate main-surface 1A. However, the shape, position, etc., of the ink swatch 7 can be modified as appropriate.

In place of the ink swatch 7, a marking ink layer formed, for example, from white paint may be employed. The marking ink layer formed with white paint enables direct formation by printing, for example, of desired characters and symbols, such as a component number, and is thus particularly preferred when a number of markings must be formed, as in the case where a number of electronic components are mounted on a printed-wiring substrate.

This application is based on Japan Patent Application No. 2000-89428, filed Mar. 28, 2000, the disclosure of which is incorporated herein by reference in its entirety.

What is claimed is:

1. A method for fabricating a printed-wiring substrate comprising an external dielectric resin layer having an opening, which external dielectric resin layer defines a substrate surface, an internal dielectric resin layer, a connection pad formed on the internal dielectric resin layer and exposed in an opening of the external dielectric resin layer, and a solder-bump formed on the connection pad exposed in the opening, which method comprises:
   roughening the substrate surface.

2. A method for fabricating a printed-wiring substrate comprising an external dielectric resin layer which defines a substrate surface, and a connection pad exposed in an opening which extends through the external dielectric resin layer, which comprises:
   roughening a surface of the external dielectric resin layer among layers of the printed-wiring substrate, in which the connection pad is exposed in an opening of the external dielectric resin layer;
   after the external-dielectric-resin-layer roughening step, forming an Ni plating layer on the connection pad exposed in the opening and then forming an Au plating layer on the Ni plating layer; and
   forming a marking ink layer on a portion of the substrate surface after the external-dielectric-resin-layer roughening step and before or after the Ni—Au-plating-layer forming step.

3. The method for fabricating a printed-wiring substrate as claimed in claim 2, further comprising:
   a solder-bump forming step for forming a solder bump on the Ni—Au plating layer on the connection pad exposed in the opening, after the Ni—Au-plating-layer forming step and the ink-layer forming step, wherein
   the ink-layer forming step is an ink-layer printing step for forming a marking ink layer on a portion of the substrate surface by printing.

4. A method for fabricating a printed-wiring substrate comprising an external dielectric resin layer which defines a substrate surface, and a connection pad exposed in an opening which extends through the external dielectric resin layer, which comprises:
   roughening a surface of the external dielectric resin layer among layers of the printed-wiring substrate, in which the connection pad is exposed in an opening of the external dielectric resin layer;
   after the external-dielectric-resin-layer roughening step, forming a plating layer on the connection pad exposed in the opening; and
   forming a marking ink layer on a portion of the substrate surface after the external-dielectric-resin-layer roughening step and before or after forming the plating layer.

5. The method for fabricating a printed-wiring substrate as claimed in claim 4, further comprising:
   a solder-bump forming step for forming a solder bump on the plating layer on the connection pad exposed in the opening, after the plating-layer forming step and the ink-layer forming step, wherein
   the ink-layer forming step is an ink-layer printing step for forming a marking ink layer on a portion of the substrate surface by printing.

6. A method for fabricating a printed-wiring substrate comprising an external dielectric resin layer having an opening, which external dielectric layer defines a substrate surface, an internal dielectric resin layer, a connection pad formed on the internal dielectric resin layer and exposed in an opening of the external dielectric resin layer, and a solder-bump formed on the connection pad exposed in the opening, which method comprises:
   roughening the surface of the internal dielectric resin layer and roughening the substrate surface so that the substrate surface has a roughness that is lower than that of the surface of said internal dielectric resin layer.

7. A printed-wiring substrate comprising an external dielectric resin layer having an opening, which external dielectric resin layer defines a substrate surface, an internal dielectric resin layer, a connection pad formed on the internal dielectric resin layer and exposed in an opening of the external dielectric resin layer, and a solder-bump formed on the connection pad exposed in the opening,
   wherein the substrate surface is a roughened surface.

8. The printed-wiring substrate as claimed in claim 7,
   wherein the substrate surface and the surface of said internal dielectric resin layer are roughened surfaces, and the substrate surface has a roughness that is lower than that of the surface of said internal dielectric resin layer.

9. The printed-wiring substrate as described in claim 7, comprising a marking ink layer formed on a portion of the substrate surface.

10. The printed-wiring substrate as described in claim 8, comprising a marking ink layer formed on a portion of the substrate surface.

* * * * *